(12) United States Patent
Shirakawa et al.

(10) Patent No.: US 7,894,262 B2
(45) Date of Patent: Feb. 22, 2011

(54) NONVOLATILE SEMICONDUCTOR STORAGE DEVICE HAVING GUARANTEED AND BACKUP BLOCKS

(75) Inventors: Masanobu Shirakawa, Chigasaki (JP); Toshio Yamamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 12/334,708

(22) Filed: Dec. 15, 2008

(65) Prior Publication Data

US 2009/0154245 A1    Jun. 18, 2009

(30) Foreign Application Priority Data

Dec. 18, 2007    (JP) .............................. 2007-325383

(51) Int. Cl.
*G11C 16/06*    (2006.01)
*G11C 16/04*    (2006.01)
*G11C 29/00*    (2006.01)

(52) U.S. Cl. ............................. 365/185.09; 365/185.11; 365/200

(58) Field of Classification Search ............. 365/185.09
See application file for complete search history.

(56) References Cited

U.S. PATENT DOCUMENTS

| 7,159,141 | B2 * | 1/2007 | Lakhani et al. ................. 714/8 |
| 7,388,782 | B2 * | 6/2008 | Tokiwa .................. 365/185.09 |
| 7,437,602 | B2 * | 10/2008 | Asari et al. ..................... 714/6 |
| 7,561,482 | B2 * | 7/2009 | Tu et al. ...................... 365/200 |
| 7,577,852 | B2 * | 8/2009 | Okazaki et al. ............. 713/189 |
| 2005/0188147 | A1 | 8/2005 | Tanaka |
| 2007/0076478 | A1 * | 4/2007 | Sanders ................. 365/185.11 |

* cited by examiner

*Primary Examiner*—Son L Mai
(74) *Attorney, Agent, or Firm*—Oblon, Spivak, McClelland, Maier & Neustadt, L.L.P.

(57) ABSTRACT

A nonvolatile semiconductor storage device includes: a memory cell array in which electrically rewritable nonvolatile memory cells are arranged; and a register that holds good/bad information on a specific area that requires high reliability in a user accessible area of the memory cell array. An address conversion circuit internally accesses, when the specific area is bad and is accessed, a backup area in the user accessible area based on the good/bad information in the register. When the specific area is bad and the backup area is accessed, on the other hand, the address conversion circuit internally accesses the specific area based on the good/bad information in the register.

20 Claims, 7 Drawing Sheets

FIG. 7

|  | BA[0] | BA[1] | BA[2] | BA[3] | BA[4] | BA[5] | BA[6] | BA[7] | BA[8] | BA[9] | BA[10] | BA[11] |
|---|---|---|---|---|---|---|---|---|---|---|---|---|
| Block Address 0 | Vss | Vss | Vss | Vss | Vss | Vss | Vss | Vss | Vss | Vss | Vss | Vss |
| Block Address 15 | Vdd | Vdd | Vdd | Vdd | Vss | Vss | Vss | Vss | Vss | Vss | Vss | Vss |
| Block Address 1023 | Vdd | Vdd | Vdd | Vdd | Vdd | Vdd | Vdd | Vdd | Vdd | Vdd | Vss | Vss |
| Block Address 2047 | Vdd | Vdd | Vdd | Vdd | Vdd | Vdd | Vdd | Vdd | Vdd | Vdd | Vdd | Vss |

NONVOLATILE SEMICONDUCTOR STORAGE DEVICE HAVING GUARANTEED AND BACKUP BLOCKS

CROSS REFERENCE TO RELATED APPLICATIONS

This application is based on and claims the benefit of priority from prior Japanese Patent Application No. 2007-325383, filed on Dec. 18, 2007, the entire contents of which are incorporated herein by reference.

BACKGROUND OF THE INVENTION

1. Field of the Invention

The present invention relates to an electrically rewritable nonvolatile semiconductor storage device (EEPROM) and more particularly to an EEPROM that achieves higher reliability of a specific area.

2. Description of the Related Art

As a type of EEPROM, NAND-type flash memory is known. In NAND flash memory, normally, a block with a specific address needs to be guaranteed as a valid block (a block that is not bad or not defective). An example of such a block includes a controller block that holds control data of a memory controller.

NAND flash memory is nonvolatile memory and accomplishes a reduction in cost of a controller by storing a part of control data used by the controller, in a specific block of the NAND flash memory. If, when the controller block is bad (defective), the memory chip is considered to be a bad chip, the product yield decreases. In the following, among a plurality of blocks, a specific block that should be particularly guaranteed to be valid as described above is referred to as a "guaranteed block".

In NAND-type flash memory, among all blocks, a certain number or less of bad blocks are allowed, whereby the yield is increased. That is, the number of blocks is determined by the number of blocks corresponding to capacity guaranteed to users and the number of allowed bad blocks.

Typical methods for dealing with a bad block occurred include the following (1) and (2).

(1) Block redundancy scheme (see, for example, Japanese Patent Application Laid-Open No. 2007-179594)

In this scheme, redundant blocks are provided separately from power-of-two user blocks. Upon product-test prior to shipping, when there is a bad user block, the block is replaced by a redundant block. Specifically, in a redundancy remedy for certain bad user block, an access to an address of the user block is actually processed as an access to a corresponding redundant block for replacement.

In such a bad address replacement control, a user recognizes, at all times, only the power-of-two blocks. The users cannot directly access the redundant blocks.

In this scheme, when the number of allowed bad blocks is smaller than the number of redundant blocks, i.e., when there are vacant redundant blocks, replacement is performed every time a bad block is detected. As for a bad block detected after there are no more vacant redundant blocks left, a bad block process is performed by merely setting a bad block flag within a row decoder without any replacement of the blocks.

In the case of this scheme, a guaranteed block may be given priority for undergoing a test. Then, if the guaranteed block is bad, a redundancy remedy is performed on the block. This allows the guaranteed block to be substantially secured as a good block.

However, in this scheme, increasing the number of redundant blocks not only increases an area occupied by the redundant blocks, but also requires a register that holds bad block addresses and an address replacement circuit, resulting in a large increase in area. Thus, when the chip area needs to be reduced as much as possible, this scheme is disadvantageous. Also, this scheme requires complex replacement control.

(2) Extended block scheme (see, for example, Japanese Patent Application Laid-Open No. 2005-216345)

In this scheme, instead of redundant blocks, a plurality of additional blocks are provided in addition to power-of-two user blocks. A required number of additional blocks is calculated from the number of blocks corresponding to capacity guaranteed to users, the rate of occurrence of bad user blocks, etc. These blocks are all user accessible areas. Note, however, that since the total number of blocks is not power of two, there are empty block addresses (blank addresses).

Also in this scheme, when a bad block is detected upon product-test prior to shipping, a bad block process is performed by setting a bad block flag within a row decoder.

The advantage of this scheme is explained as follows. Specifically, as long as blank addresses are properly under control, increase in the number of blocks does not cause increase in area except for an increase in area for added blocks. Also, control therefor is easier than the block redundancy scheme.

This scheme is more effective under circumstances where a cell array is well miniaturized, thus the number of blocks per chip is increased, and the number of allowable bad blocks is also increased.

In this scheme, however, when a guaranteed block is bad and is not remedied, the chip have to be treated as a bad chip, lowering the product yield.

SUMMARY OF THE INVENTION

A nonvolatile semiconductor storage device according to one aspect of the present invention includes: a memory cell array in which electrically rewritable nonvolatile memory cells are arranged; a register that holds good/bad information on a specific area that requires high reliability in a user accessible area of the memory cell array; and an address conversion circuit that internally accesses a backup area in the user accessible area based on the good/bad information in the register when the specific area is bad and is accessed, whereas internally accesses the specific area based on the good/bad information in the register, when the specific area is bad and the backup area is accessed.

BRIEF DESCRIPTION OF THE DRAWINGS

FIG. 7 is a diagram showing block addresses of guaranteed blocks and their backup blocks.

DETAILED DESCRIPTION OF THE EMBODIMENTS

In the "extended block scheme" described in the background art, it is necessary to secure reliability of a guaranteed block. To accomplish this object, allowing the guaranteed block to have a dedicated backup block may be considered. For example, upon a product-test prior to shipping, a ROM fuse area is allowed to have good/bad information on a guaranteed block. When the guaranteed block is accessed and turned out to be good, the guaranteed block is accessed. In contrast, when the guaranteed block is bad, a backup block is allowed to be internally accessed.

Alternatively, the ROM fuse area may be allowed to have good/bad information on a backup block. When the guaranteed block is accessed and the backup block is turned out to be good, the backup block is internally accessed. In contrast, when the backup block is bad, a guaranteed block is allowed to be accessed.

In this scheme, when either a guaranteed block or a backup block is good, the guaranteed block becomes valid, improving the yield. However, when both the guaranteed block and the backup block are good blocks, either one of them becomes an unused block (not used), and thus there is a drawback in that the unused block is wasted.

An embodiment of the present invention has overcome this problem. Specifically, this embodiment sets a backup block in a user accessible area. In addition, when both a guaranteed block and a backup block are good blocks, these blocks are made accessible without being wasted.

The embodiment of the present invention will be described below with reference to the drawings.

Figure 1:
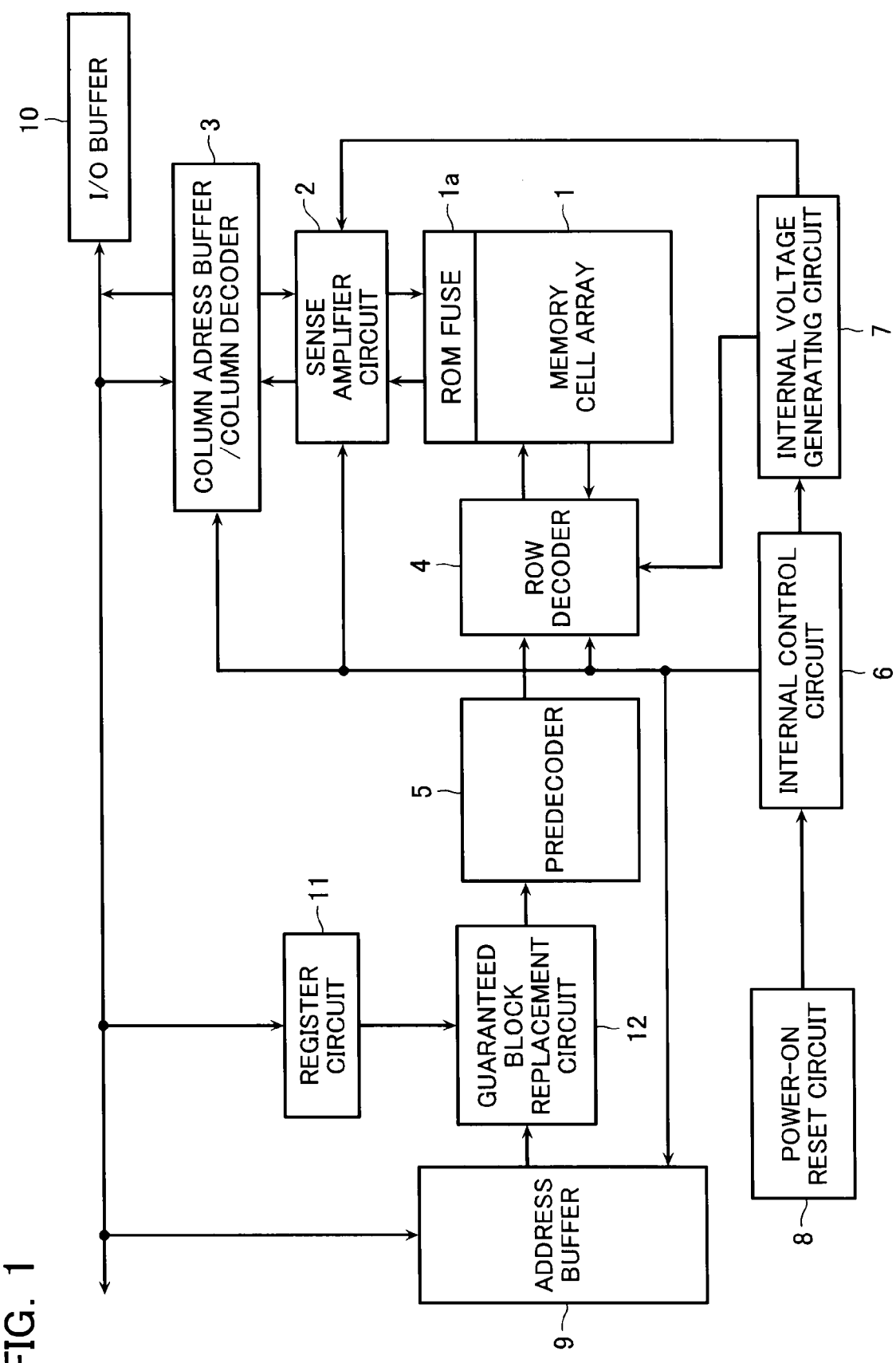
FIG. 1 is a diagram showing a functional block configuration of NAND-type flash memory according to one embodiment.
Figure 2:
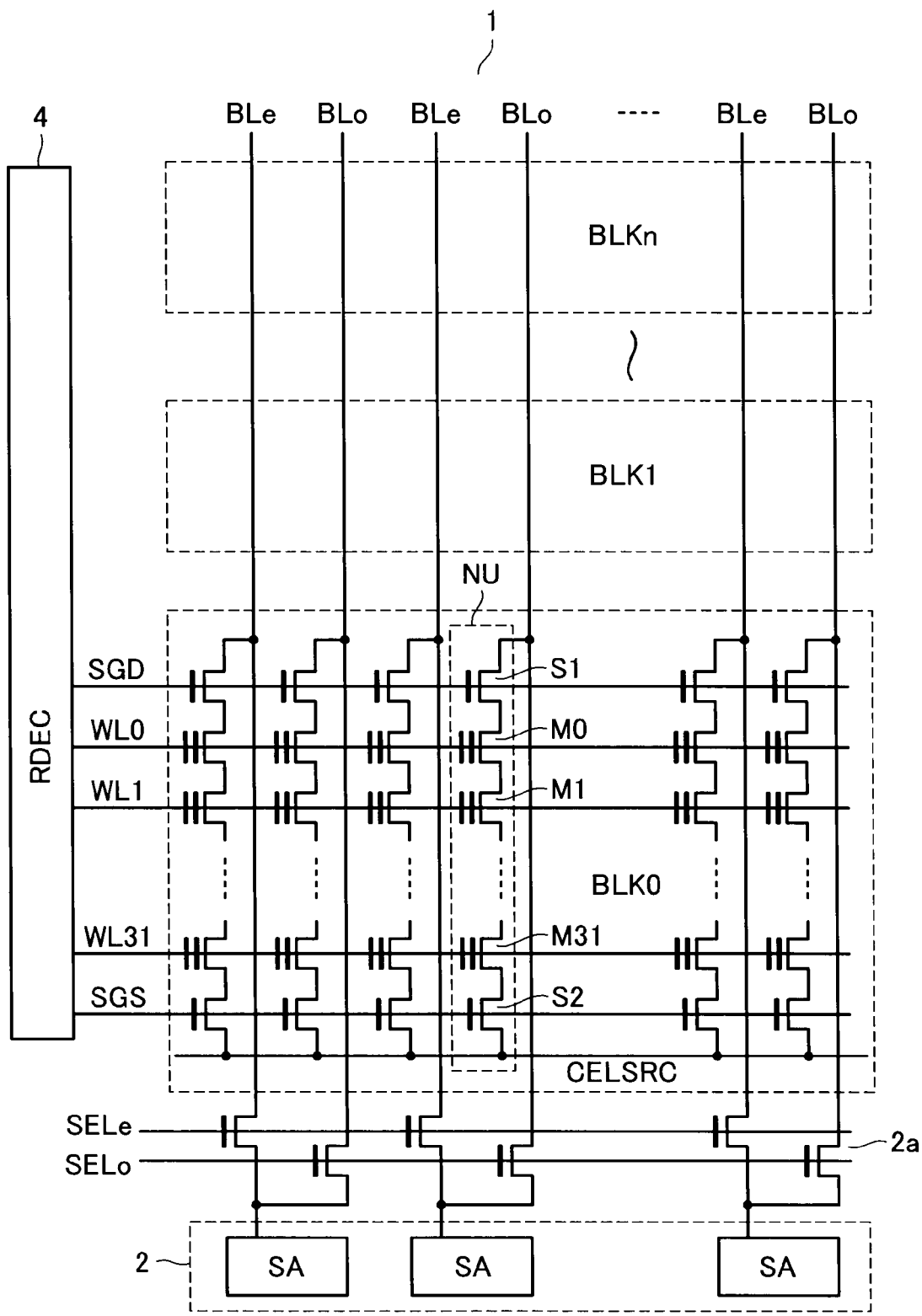
FIG. 2 is a diagram showing a memory cell array configuration of the flash memory.

FIG. 1 shows a functional block configuration of NAND-type flash memory according to one embodiment. FIG. 2 shows a configuration of a memory cell array 1 of the NAND-type flash memory.

The memory cell array 1 includes NAND cell units (NAND strings) NU arranged in a matrix. Each NAND cell unit NU has a plurality of (32 in the example of FIG. 2) electrically rewritable nonvolatile memory cells M0 to M31 which are connected in series with one another; and selection gate transistors S1 and S2 for connecting both ends of the memory cells M0 to M31 to a bit line BL and a source line CELSRC.

Control gates of the memory cells in the NAND cell unit are respectively connected to different word lines WL0 to WL31. Gates of the selection gate transistors S1 and S2 are respectively connected to selection gate lines SGD and SGS.

A set of NAND cell units that share the word lines WL0 to WL31 constitutes a block which is a unit of erasing data. As shown in FIG. 2, a plurality of blocks BLK0, BLK1, . . . are disposed in a bit-line direction.

Figure 3:
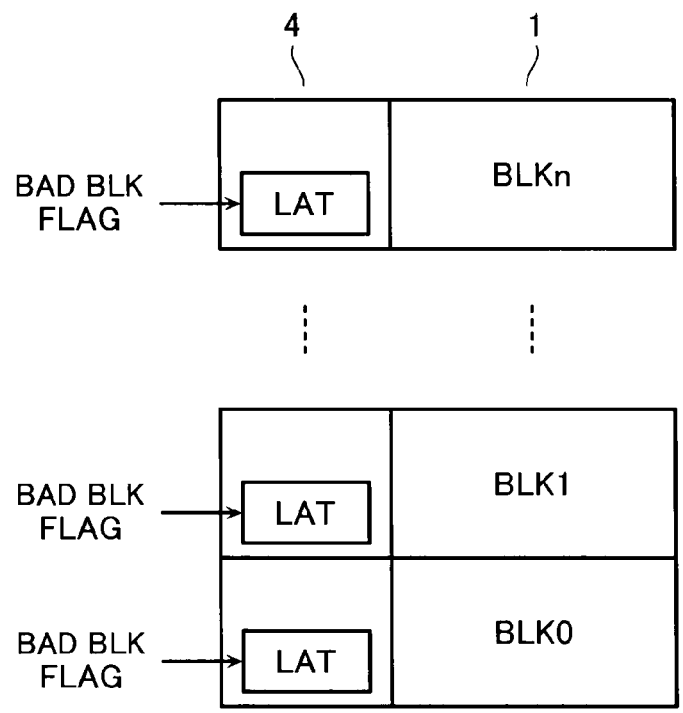
FIG. 3 is a diagram showing a row decoder configuration of the flash memory.

A predecoder 5 and a row decoder 4 each decode a row address to be transmitted thereto through an address buffer 9 and then selectively drive a word line and a selection gate line. As shown in FIG. 3, the row decoder 4 includes latches LATs for holding bad block flags. A bad block flag is set in a portion of the row decoder 4 corresponding to a block having been determined to be bad upon testing prior to shipping and when the block is accessed, the fact that the block is bad is notified.

A sense amplifier circuit 2 is connected to bit lines and performs a data readout on a page-by-page basis, and also serves as a data register that holds write data for one page. The example of FIG. 2 uses a scheme in which two adjacent bit lines BLe and BLo share one sense amplifier SA. Two adjacent bit lines BLe and BLo are selectively connected to a corresponding sense amplifier SA by a column gate circuit 2a which is controlled by a column decoder 3.

A set of memory cells arranged along one word line constitutes one sector which is simultaneously accessed. In the scheme shown in FIG. 2 in which adjacent two bit lines share a sense amplifier, a set of memory cells along one word line constitutes two sectors. In the case of a binary storage scheme one sector corresponds to one page, and in the case of a quaternary storage scheme one sector corresponds to two pages (the upper page and the lower page).

The transfer of data between the sense amplifier circuit 2 and external input/output terminals I/O is performed through an I/O buffer 10.

An internal control circuit 6 performs control of data write and erase sequences and control of a readout operation, based on various external control signals and commands CMD to be supplied thereto through a memory controller (external controller) disposed external to the memory chip.

An internal voltage generating circuit 7 is controlled by the internal control circuit 6 to generate various internal voltages required for write, erase, and readout operations. For the internal voltage generating circuit 7, a booster circuit is used to generate internal voltages that are higher than a power supply voltage.

In the memory cell array 1, as will be described later, one or a plurality of specific blocks are set as guaranteed blocks. Upon testing prior to shipping, good/bad information on the guaranteed block is detected and the information is written in a specific information registration area (hereinafter, referred to as a ROM fuse area) 1a of the memory cell array 1. When power is turned on, a power-on reset circuit 8 operates and the internal control circuit 6 automatically reads out the good/bad information on the guaranteed block in the ROM fuse area 1a. Then, it transfers and stores the information in a register circuit 11.

A guaranteed block replacement circuit 12 is an address conversion circuit that performs address conversion control based on the good/bad information on the guaranteed block stored in the register circuit 11. Specifically, when the guaranteed block is bad and is accessed, a backup block is internally accessed, whereas when the guaranteed block is bad and the backup block is accessed, the guaranteed block is internally accessed.

Figure 4:
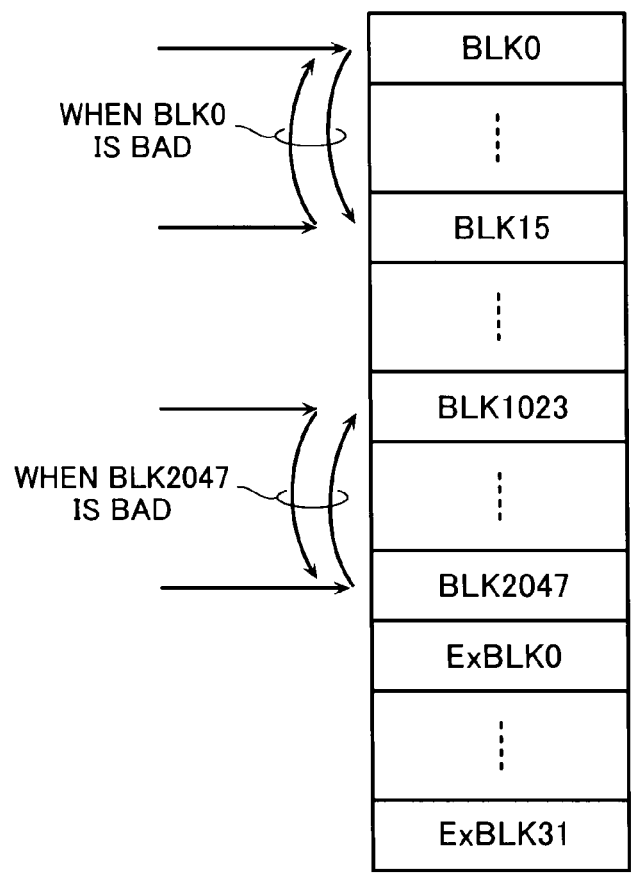
FIG. 4 is a diagram for describing a block configuration of the flash memory and an access scheme thereof.

The address conversion control for a guaranteed block will be specifically described below. It is assumed here that, as shown in FIG. 4, the memory cell array 1 has, as a user accessible area, 2 to the 11th power=2048 blocks BLK0 to BLK2047 as well as 32 additional (extended) blocks ExBLK0 to ExBLK31.

In such a block configuration, it is assumed that the block BLK0 with the first block address, and the block BLK2047 with the last block address BA except for the extended blocks are defined as guaranteed blocks. Also, the blocks BLK15 and BLK1023 are selected as replacing blocks for when the block BLK0 and the block BLK2047 are bad, respectively.

The flash memory of the present embodiment does not replace a bad block by a redundant block. Specifically, extended block portions corresponding to conventional redundant blocks are also assigned with block addresses and are dealt as a user accessible area. Also, the extended block portions are managed by an external source, e.g., a control engine.

When there is a bad block, for example, the control engine detects the bad block and does not perform an erase/write on the bad block (does not use the bad block). In this example, even when 32 bad blocks occur, storage capacity for 2048 blocks can be secured. When no bad block occurs, 2080 blocks may be dealt as the user accessible area.

As described above, in the flash memory of the present embodiment, upon testing prior to shipping, good/bad information on the guaranteed blocks is obtained. The information is stored in the ROM fuse area 1a, and the information is read out by a power-on reset operation and then held in the register circuit 11.

When the guaranteed block BLK0 is accessed and turned out to be normal, both the guaranteed block BLK0 and its backup block BLK15 can be accessed normally.

In contrast, when the guaranteed block BLK0 turned out to be bad, the following block conversion control is performed by the guaranteed block replacement circuit 12. Specifically, based on the information in the register circuit 11, when the guaranteed block BLK0 is accessed, the block BLK15 is accessed instead of the guaranteed block BLK0. In contrast, when the block BLK15 is accessed, the guaranteed block BLK0 is accessed instead. Specifically, when the guaranteed block BLK0 is bad, and the guaranteed block BLK0 is accessed from external such as a controller, the guaranteed block BLK0 may be accessed as if it is a normal block. This is because the guaranteed block BLK15 is internally accessed instead. That is, external means such as a controller recognizes the guaranteed block BLK0 to be a normal block.

On the other hand, when the guaranteed block BLK15 is accessed from external means such as a controller, the guaranteed block BLK0 will be accessed internally. In this case, since the guaranteed block BLK0 is bad, a bad block flag is set in the row decoder 4 in advance. That is, the external means such as a controller recognizes the guaranteed block BLK15 to be a bad block.

Also, between the guaranteed block BLK2047 and its backup block BLK1023, when the guaranteed block BLK2047 is bad, the same replacement control as that described above is performed.

Figure 5:
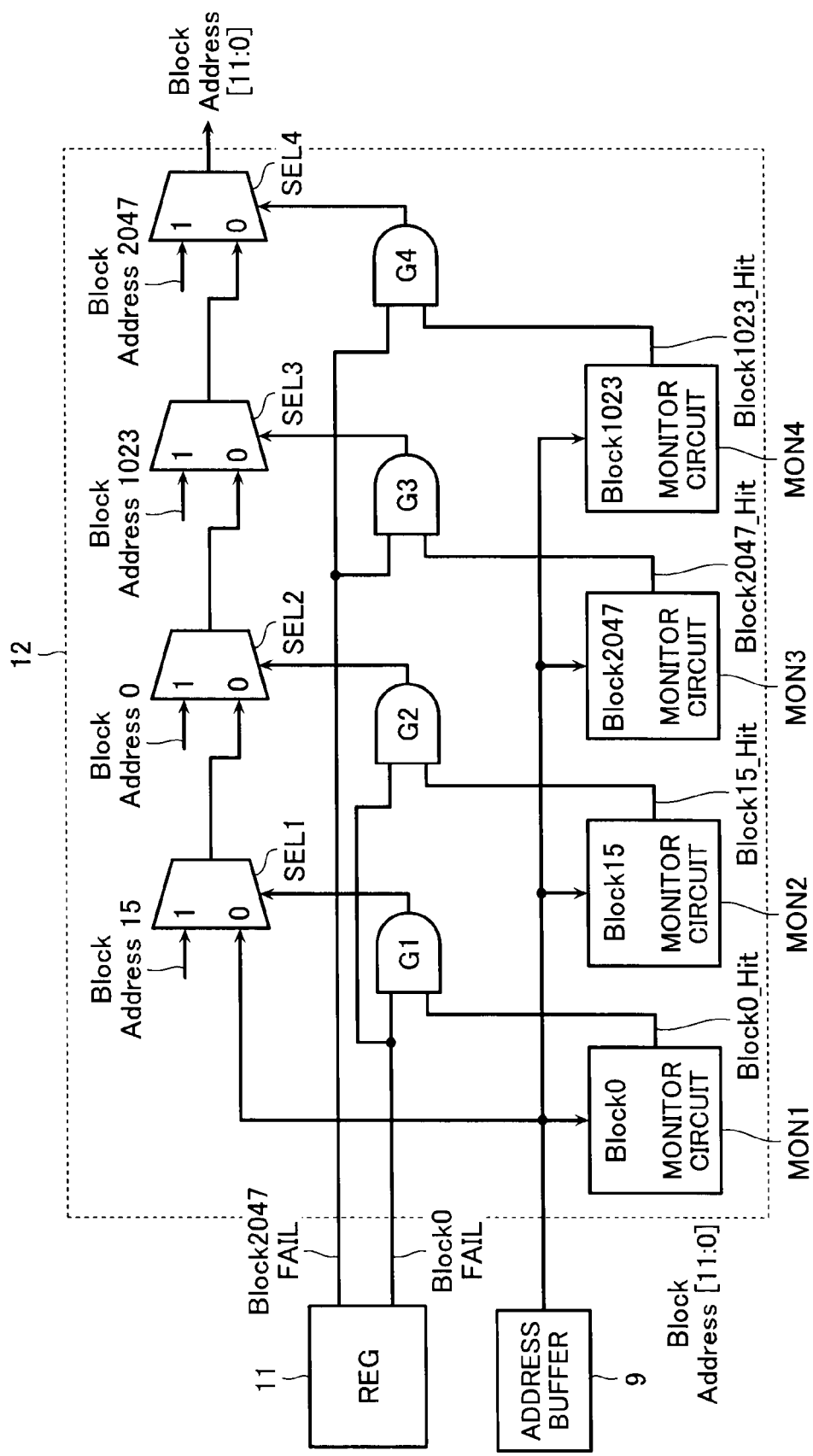
FIG. 5 is a diagram showing an exemplary configuration of a guaranteed block replacement circuit of the flash memory.

FIG. 5 shows a specific configuration example of the guaranteed block replacement circuit 12. The guaranteed block replacement circuit 12 has block address monitor circuits MON1 and MON3 configured to detect, based on row addresses supplied thereto through the address buffer 9, that the guaranteed blocks BLK0 and BLK2047 have been accessed. The guaranteed block replacement circuit 12 further has block address monitor circuits MON2 and MON4 for detecting that the backup blocks BLK15 and BLK1023 have been accessed.

Figure 6:
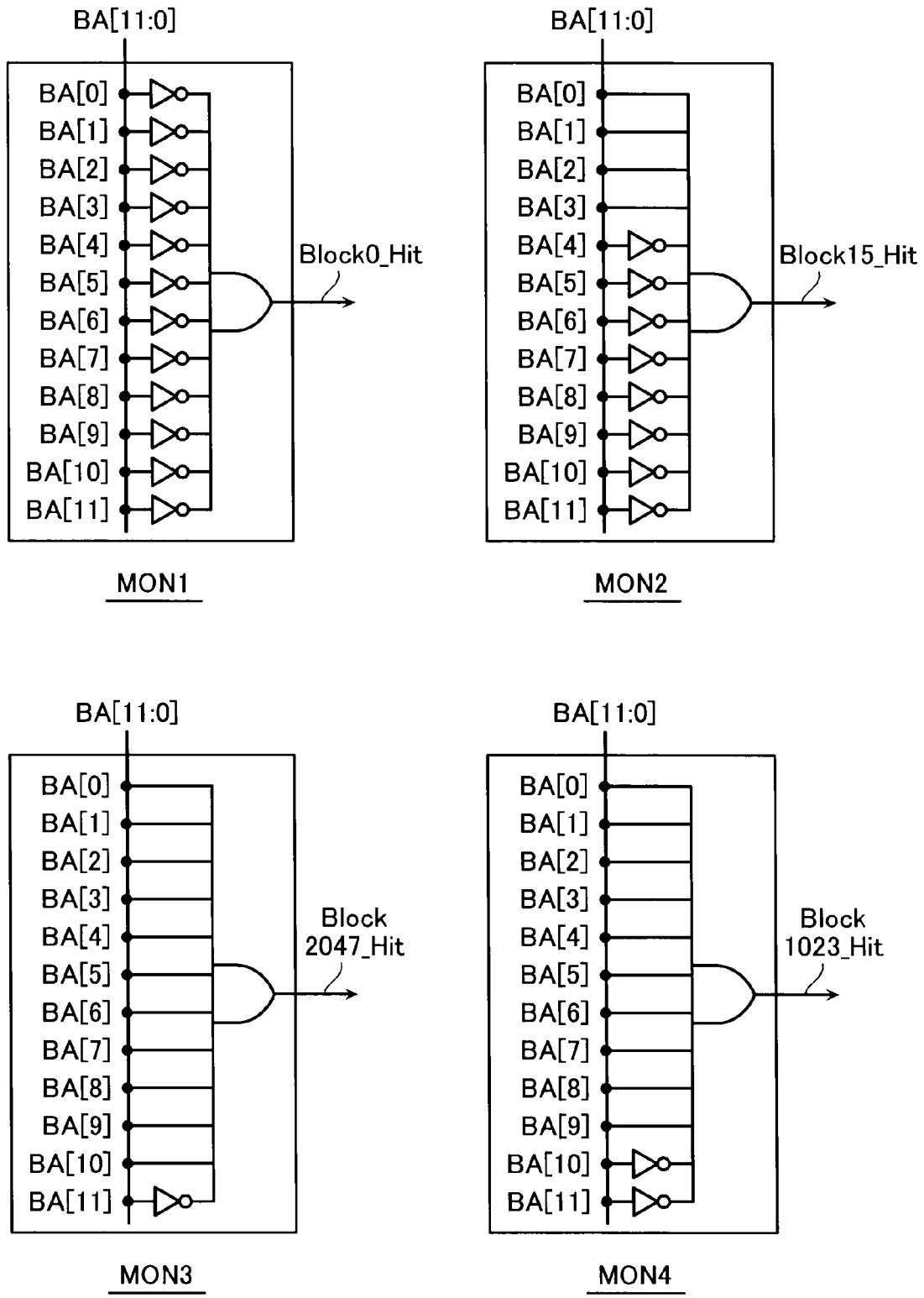
FIG. 6 is a diagram showing configurations of block address monitors of the guaranteed block replacement circuit.

As shown in FIGS. 6 and 7, the monitor circuit MON1 detects that 12-bit signals BA [0] to [11] as a block address are all "L" (=Vss) to output a detection signal Block0_Hit for Blockaddress0.

The monitor circuit MON2 detects that signals BA [0] to [3] are "L" and the others are "H" (=Vdd) to output a detection signal Block15_Hit for BlockAddress15. Likewise, the monitor circuits MON3 and MON4 respectively detect BlockAddress2047 and BlockAddress1023 to output detection signals Block2047_Hit and Block1023_Hit.

Good/bad information Block0FAIL on the guaranteed block Block0 is inputted from the register circuit 11 to AND gates G1 and G2. These AND gates G1 and G2 are activated by the outputs from the monitor circuits MON1 and MON2.

Similarly, good/bad information Block2047FAIL on the guaranteed block Block2047 is inputted from the register circuit 11 to AND gates G3 and G4. These AND gates G3 and G4 are activated by the outputs from the monitor circuits MON3 and MON4. These information signals Block0FAIL and Block2047FAIL are "H" when the corresponding block is bad.

Selectors SEL1 to SEL4 are disposed that are respectively controlled by outputs from the gates G1 to G4 to perform address switching.

For example, when the guaranteed block Block0 is bad, and the guaranteed block Block0 is accessed, an output from the gate G1 is "H" due to a monitor signal Block0_Hit and bad information Block0FAIL. In response to this, the selector SEL1 selects a block address of the backup Block15 instead of an inputted address. Since a bad block flag is not set in a portion of the row decoder 4 corresponding to the Block15, the Block15 is accessed normally. Namely, despite the fact that externally the block address 0 (bad) is specified, the block address 0 has substantially been able to be accessed as a good block.

When the Block0 is bad, and the backup block Block15 is accessed, an output from the gate G2 is "H" due to a monitor signal Block15_Hit and bad information Block0FAIL. Then, the selector SEL2 selects a block address of the guaranteed block Block0 instead of an inputted address. In this case, since the guaranteed block Block0 is bad and thus a bad block flag is set in a portion of the row decoder 4 corresponding thereto, the block Block0 is appropriately processed (so as not to adversely affect the other sequences) as a block on which write/readout/erase operations are not performed.

Also, when the guaranteed block Block2047 is bad, address replacement control between the Block2047 and the Block1023 is performed similarly by the selectors SEL3 and SEL4.

As described above, according to the present embodiment, by setting a backup block for a guaranteed block, the reliability of the guaranteed block can be substantially increased. Moreover, when both a guaranteed block and a backup block are good blocks, both blocks can be used without being wasted. In addition, by adopting an extended block scheme, an increase in area can be suppressed as compared with the case of a redundant block scheme.

Meanwhile, in BIST (Built-In Self Test), in order for a tester to make a good/bad determination of each block, it is desirable that the memory has a mode that invalidates the function of the guaranteed block replacement circuit 12. Let us suppose the case that the first block Block0 is a guaranteed block and is determined to be bad as a result of a test, and according to the test result, the guaranteed block replacement circuit 12 activates an address replacement function thereof. In this case, even if a test on the block Block15 is attempted thereafter, the block Block0 is accessed as a result of address conversion, resulting in that the block is determined to be bad again.

Figure 8:
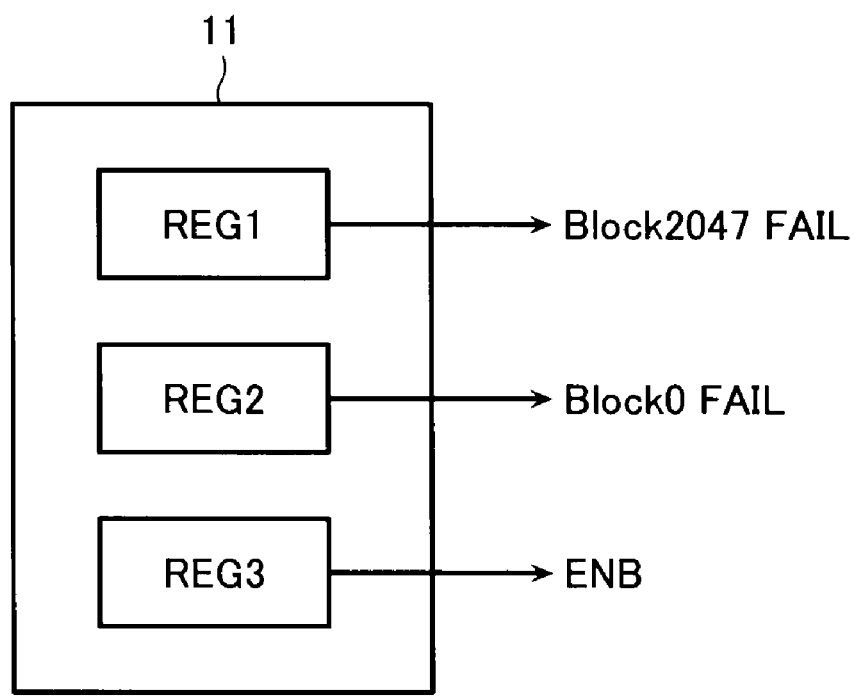
FIG. 8 is a diagram showing a register circuit configuration example including a register that can select valid/invalid of the guaranteed block replacement circuit.

To avoid such an event, for example, as shown in FIG. 8, a register REG3 may be provided in addition to the registers REG1 and REG2 that hold good/bad information Block0FAIL and Block2047FAIL. The register REG3 may output a signal ENB for setting valid/invalid of the address replacement function of the guaranteed block replacement circuit 12.

The signal ENB is inputted in common to the AND gates G1 to G4 to which good/bad information Block0FAIL and Block2047FAIL is inputted. Upon testing, the signal ENB is "L" to make the function of the guaranteed block replacement circuit 12 invalid. Specifically, the signal ENB sets a state in which an input address is allowed to pass through as it is. At normal times, the signal ENB is set to be "H" to make the function of the guaranteed block replacement circuit 12 valid.

By doing so, a test is sequentially performed from the first block Block0. Even in this case, regardless of whether the first block Block0 is good or bad, the backup block Block15 can be tested.

Moreover, it may be proper to similarly invalidate the function of the guaranteed block replacement circuit 12 when other various tests, defect analysis or the like are performed, in order to notify the tester of which physical address being actually accessed.

Note that it is desirable that a guaranteed block be easy to access. In terms of this, blocks that are preferable to be selected as guaranteed blocks in addition to BLK0 and BLK2047 in the above-described embodiment include BLK1 and the last block ExBLK31 in an extended block area. One or a plurality of blocks exemplified here may preferably be used as a guaranteed blocks.

Note also that although in the above-described embodiment one backup block is prepared for one guaranteed block, a plurality of backup blocks can also be prepared for one guaranteed block. In this case, such replacement control may be performed that when the guaranteed block is bad and a first candidate backup block is bad, a second candidate backup block may preferably be used.

What is claimed is:

1. A nonvolatile semiconductor storage device comprising:
    a memory cell array in which electrically rewritable nonvolatile memory cells are arranged, the memory cell array including a plurality of blocks, at least one of the blocks being defined as a guaranteed block that requires higher reliability than the other blocks, and the guaranteed block being provided with a backup block dedicated thereto;
    a register that holds good/bad information on the guaranteed block; and
    an address conversion circuit that internally accesses the backup block based on the good/bad information in the register when the guaranteed block is bad and is accessed, whereas internally accesses the guaranteed block based on the good/bad information in the register, when the guaranteed block is bad and the backup block is accessed.

2. The nonvolatile semiconductor storage device according to claim 1, wherein the memory cell array includes, as a user accessible area, a plurality of extended blocks in addition to power-of-two ones of the blocks.

3. The nonvolatile semiconductor storage device according to claim 1, wherein the memory cell array has an information registration area for writing the good/bad information on the guaranteed block that is obtained based on a test, and the good/bad information is read out by a power-on reset operation and then held in the register.

4. The nonvolatile semiconductor storage device according to claim 1, further comprising: a row decoder that selects a block of the memory cell array according to an input address and that has a latch where a bad block flag is set, in a decoder portion corresponding to a bad block.

5. The nonvolatile semiconductor storage device according to claim 4, wherein the memory cell array includes, as a user accessible area, a plurality of extended blocks in addition to power-of-two ones of the blocks.

6. The nonvolatile semiconductor storage device according to claim 4, wherein the memory cell array has an information registration area for writing the good/bad information on the guaranteed block that is obtained based on a test, and the good/bad information is read out by a power-on reset operation and then held in the register.

7. The nonvolatile semiconductor storage device according to claim 1, wherein the memory cell array includes NAND cell units arranged therein, each NAND cell unit including a plurality of the nonvolatile memory cells connected in series with one another and selection gate transistors respectively connected to both ends of the nonvolatile memory cells.

8. The nonvolatile semiconductor storage device according to claim 7, wherein the memory cell array includes, as a user accessible area, a plurality of extended blocks in addition to power-of-two ones of the blocks.

9. The nonvolatile semiconductor storage device according to claim 1, wherein the guaranteed block and the backup block are located in positions physically distant from each other in the memory cell array.

10. The nonvolatile semiconductor storage device according to claim 1, further comprising a register for setting valid/invalid of a function of the address conversion circuit.

11. The nonvolatile semiconductor storage device according to claim 10, wherein the memory cell array includes, as a user accessible area, a plurality of extended blocks in addition to power-of-two ones of the blocks.

12. The nonvolatile semiconductor storage device according to claim 10, wherein the memory cell array has an information registration area for writing the good/bad information on the guaranteed block that is obtained based on a test, and the good/bad information is read out by a power-on reset operation and then held in the register.

13. The nonvolatile semiconductor storage device according to claim 10, further comprising a row decoder that selects a block of the memory cell array according to an input address and that has a latch where a bad block flag is set, in a decoder portion corresponding to a bad block.

14. The nonvolatile semiconductor storage device according to claim 1, wherein the address conversion circuit includes:
    an address monitor circuit respectively for detecting that the guaranteed block and the backup block have been accessed;
    a gate that conducts AND operation of the good/bad information in the register and an output from the address monitor circuit; and
    a selector that is respectively controlled by the output from the gate, and select, when the guaranteed block is bad, a backup block address instead of an input address selecting the guaranteed block, or the guaranteed block address instead of an input address selecting the backup block.

15. The nonvolatile semiconductor storage device according to claim 14, wherein the memory cell array includes, as a user accessible area, a plurality of extended blocks in addition to power-of-two ones of the blocks.

16. The nonvolatile semiconductor storage device according to claim 14, wherein the memory cell array has an information registration area for writing the good/bad information on the guaranteed block that is obtained based on a test, and the good/bad information is read out y a power-on reset operation and then held in the register.

17. A nonvolatile semiconductor storage device comprising:
    a memory cell array in which electrically rewritable nonvolatile memory cells are arranged, the memory cell array including a plurality of blocks, at least one of the blocks being assigned as a guaranteed block that requires higher reliability than the other blocks, and the guaranteed block being provided with a backup block dedicated thereto; and an address conversion circuit that internally accesses the backup block when the guaranteed block is bad and is accessed, whereas internally accesses the guaranteed block when the guaranteed block is bad and the backup block is accessed.

18. The nonvolatile semiconductor storage device according to claim 17, wherein the memory cell array includes, as a user accessible area, a plurality of extended blocks in addition to power-of-two ones of the blocks.

19. The nonvolatile semiconductor storage device according to claim 17, further comprising a row decoder that selects a block of the memory cell array according to an input address and that has a latch where a bad block flag is set, in a decoder portion corresponding to a bad block.

20. The nonvolatile semiconductor storage device according to claim 17, wherein the guaranteed block and the backup block are located in positions physically distant from each other in the memory cell array.

* * * * *